United States Patent
Belady

(10) Patent No.: US 7,773,385 B2
(45) Date of Patent: Aug. 10, 2010

(54) COMPUTER SERVER RECEIVING A PLURALITY OF DIFFERENT POWER SUPPLY MODULES

(75) Inventor: Christian L. Belady, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1076 days.

(21) Appl. No.: 11/191,368

(22) Filed: Jul. 27, 2005

(65) Prior Publication Data

US 2007/0025090 A1 Feb. 1, 2007

(51) Int. Cl.
*H05K 7/16* (2006.01)
(52) U.S. Cl. ........................ 361/727; 361/731
(58) Field of Classification Search ................. 361/727, 361/731, 724
See application file for complete search history.

(56) References Cited

U.S. PATENT DOCUMENTS

| | | | | |
|---|---|---|---|---|
| 6,091,609 A | * | 7/2000 | Hutson et al. | 361/794 |
| 6,148,352 A | * | 11/2000 | Coale et al. | 710/100 |
| 6,208,522 B1 | * | 3/2001 | Manweiler et al. | 361/752 |
| 6,325,636 B1 | * | 12/2001 | Hipp et al. | 439/61 |
| 6,594,150 B2 | * | 7/2003 | Creason et al. | 361/727 |
| 6,947,287 B1 | * | 9/2005 | Zansky et al. | 361/731 |
| 7,379,305 B2 | * | 5/2008 | Briggs et al. | 361/727 |

* cited by examiner

*Primary Examiner*—Hae Moon Hyeon

(57) ABSTRACT

A computer server is configured to electrically and mechanically couple with a plurality of different power modules. These power modules are interchangeable, and all fit within the form factor of the server, eliminating the use of PDUs within the server rack. The server may be configured in the factory or in the field to use either the single-phase AC power configuration, the 3-phase AC power configuration, or any other power configuration, such as DC, desired.

16 Claims, 5 Drawing Sheets

US 7,773,385 B2

COMPUTER SERVER RECEIVING A PLURALITY OF DIFFERENT POWER SUPPLY MODULES

FIELD OF THE INVENTION

The present invention relates generally to the field of computer servers, and more particularly to the field of power cables for servers.

BACKGROUND OF THE INVENTION

In the past, most computer servers have been designed for either single-phase AC (smaller servers) or 3-phase AC (larger servers) power configurations. Mid-range servers have had to choose between these two power supply configurations, and have had to provide power distribution units (PDUs) to convert server to the other power supply configuration. These PDUs create extra complexity, cost, and size to the server system. They require space within the server rack in addition to that of the server itself.

Single phase power configurations typically require more power cables than 3-phase or dual redundant grid power configurations. Also, as power density within servers increases, server form factors tend to migrate from the single-phase configuration to the 3-phase configuration. Customers who have used exclusively single-phase power configurations may be reluctant to convert to using 3-phase power configurations.

SUMMARY OF THE INVENTION

A computer server is configured to electrically and mechanically couple with a plurality of different power modules. These power modules are interchangeable, and all fit within the form factor of the server, eliminating the use of PDUs within the server rack. The server may be configured in the factory or in the field to use either the single-phase AC power configuration, the 3-phase power AC configuration, or any other power configuration, such as DC, desired.

Other aspects and advantages of the present invention will become apparent from the following detailed description, taken in conjunction with the accompanying drawings, illustrating by way of example the principles of the invention.

DETAILED DESCRIPTION

Figure 1A:
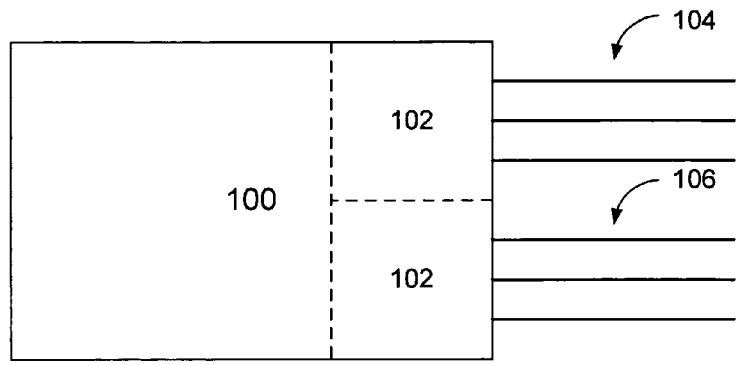
FIG. 1A is a block diagram of a prior art single-phase server.

This description of the preferred embodiments is intended to be read in connection with the accompanying drawings, which are to be considered part of the entire written description of this invention. In the description, relative terms such as "lower," "upper," "horizontal," "vertical," "up," "down," "top," "bottom," "left," and "right" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms concerning attachments, coupling and the like, such as "connected," "coupled," and "interconnected," refer to a relationship wherein structures are secured or attached to one another either directly or indirectly through intervening structures, as well as both movable or rigid attachments or relationships, unless expressly described otherwise.

FIG. 1A is a block diagram of a prior art single-phase server. In this prior art example a server 100 including two single-phase AC power supply modules 102 is designed. The two single-phase AC power supply modules 102 include a plurality of power grids 104 and 106, configured to electrically couple to a first single-phase AC power supply grid 104 and to electrically couple to a second single-phase AC power supply grid 106.

Figure 1B:
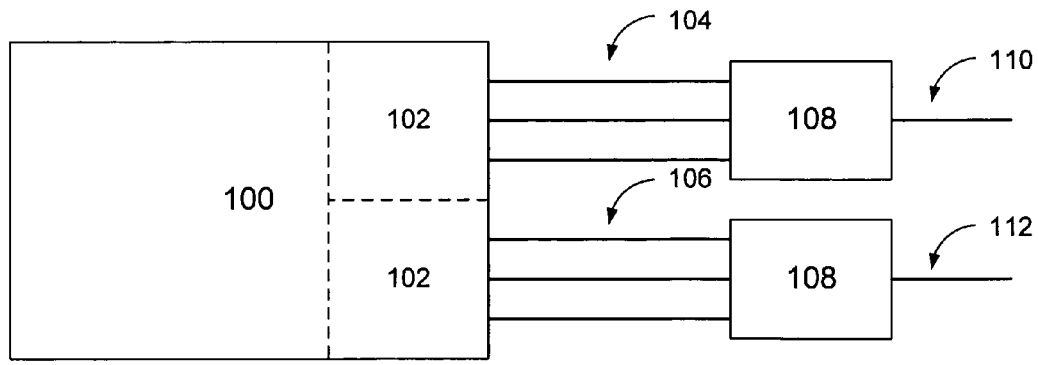
FIG. 1B is a block diagram of the prior art single-phase server from FIG. 1A as configured to a 3-phase AC power configuration by the addition of PDUs.

FIG. 1B is a block diagram of the prior art single-phase server from FIG. 1A as configured to a 3-phase AC power configuration by the addition of PDUs. When the example prior art server from FIG. 1A is to be used with 3-phase AC power grids, a pair of power distribution units (PDUs) 108 are used to convert the 3-phase AC power inputs grids 110 and 112 from a first 3-phase AC power supply grid 110 and a second 3-phase AC power supply grid 112, to a first single-phase AC power supply grid 104, and a second single-phase AC power supply grid 106 respectively.

Figure 2A:
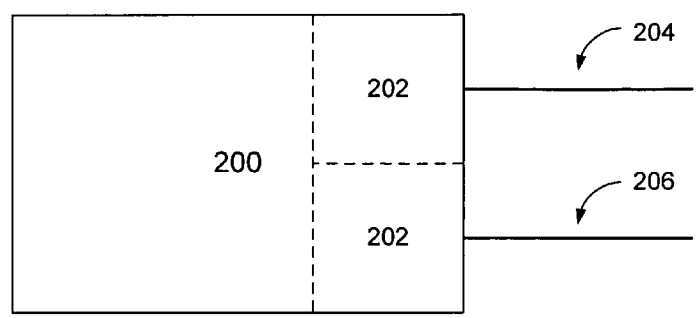
FIG. 2A is a block diagram of a prior art 3-phase AC server.

FIG. 2A is a block diagram of a prior art 3-phase server. In this prior art example a server 200 including two 3-phase AC power supply modules 202 is designed. The two 3-phase AC power supply modules 202 include power grids 204 and 206, configured to electrically couple to a first 3-phase AC power supply grid 204 and to electrically couple to a second 3-phase AC power supply grid 206.

Figure 2B:
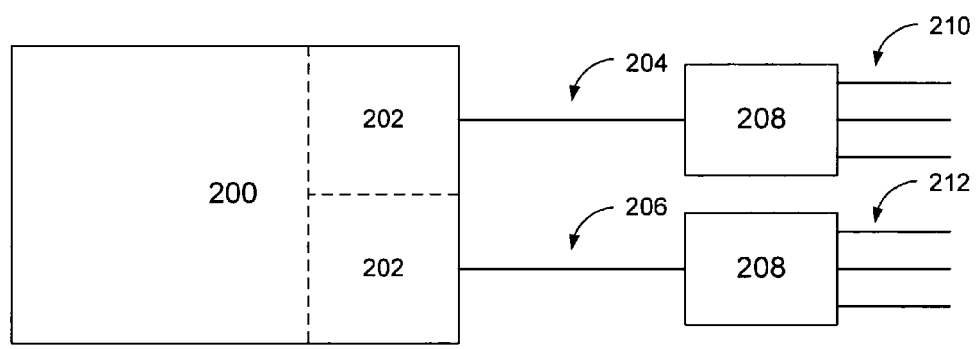
FIG. 2B is a block diagram of the prior art 3-phase AC server from FIG. 2A as configured to a single-phase power configuration by the addition of PDUs.

FIG. 2B is a block diagram of the prior art 3-phase server from FIG. 2A as configured to a single-phase power configuration by the addition of PDUs. When the example prior art server from FIG. 2A is to be used with single-phase power grids, a pair of power distribution units (PDUs) 208 are used to convert the single-phase power grids 210 and 212 from a first single-phase power supply grid 210 and a second single-phase power supply grid 212, to a first 2-phase power supply grid 204, and a second 3-phase power supply grid 206 respectively.

Figure 3:
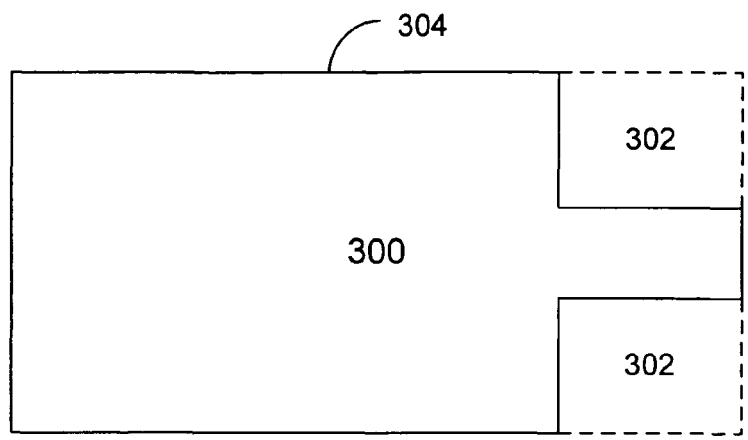
FIG. 3 is a block diagram of an example embodiment of a server configured to accept a plurality of power modules according to the present invention.

FIG. 3 is a block diagram of an example embodiment of a server configured to accept a plurality of power modules according to the present invention. In this example embodiment of a server according to the present invention, a server 300, including a server chassis 304, is configured to removeably electrically and mechanically couple with a plurality of power supply modules. The power supply modules interchangeably (and non-permanently) couple with the server chassis 304, each in a power supply module bay 302. This example embodiment shows a server 300 with two power supply module bays 302, while those of skill in the art will recognize that any positive integer number of power module bays 302 may be used within the scope of the present invention. Those of skill in the art will understand that while this example embodiment of the present invention includes rectangular power supply module bays 302, these bays 302 may be any shape imaginable within the scope of the present invention.

Figures 4A, 4B:
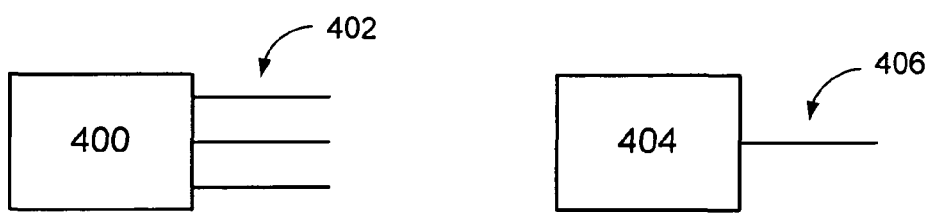
FIG. 4A is a block diagram of an example embodiment of a single-phase AC power module according to the present invention.
FIG. 4B is a block diagram of an example embodiment of a 3-phase AC power module according to the present invention.

FIG. 4A is a block diagram of an example embodiment of a single-phase power module according to the present invention. This example embodiment of a single-phase power module 400 includes power supply cables 402 configured to electrically couple the single-phase AC power module 400 to a single-phase AC power source. This single-phase AC power module 400 is configured to electrically couple with the server 300 of FIG. 3, in the power supply module bays 302 incorporated into the server chassis 304. Those of skill in the art will recognize that any positive integer number of power supply cables 402 may be used within the scope of the present invention.

FIG. 4B is a block diagram of an example embodiment of a 3-phase AC power module according to the present invention. This example embodiment of a 3-phase AC power module 404 includes a power supply cable 406 configured to electrically couple the single-phase AC power module 404 to a 3-phase AC power source. This 3-phase AC power module 404 is configured to electrically couple with the server 300 of FIG. 3, in the power supply module bays 302 incorporated into the server chassis 304. Those of skill in the art will recognize that any positive integer number of power supply cables 406 may be used within the scope of the present invention.

Figure 4C:
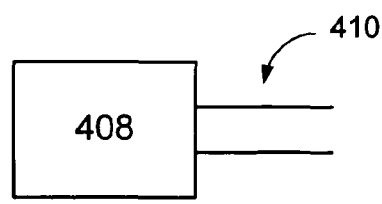
FIG. 4C is a block diagram of an example embodiment of a DC power module according to the present invention.

FIG. 4C is a block diagram of an example embodiment of a DC power module according to the present invention. This example embodiment of a DC power module 408 includes a pair of power supply cables 410 configured to electrically couple the DC power module 408 to a DC power source. This DC power module 408 is configured to electrically couple with the server 300 of FIG. 3, in the power supply module bays 302 incorporated into the server chassis 304. Those of skill in the art will recognize that any positive integer number of power supply cables 410 may be used within the scope of the present invention.

While the example embodiments of power modules described above show one, two, or three power supply cables, those of skill in the art will recognize that any number of power supply cables may be used with each power module within the scope of the present invention. For example, single-phase AC power and DC power often require two cables, while 3-phase AC power commonly requires four cables, and additional cables may be added as required.

Figure 5A:
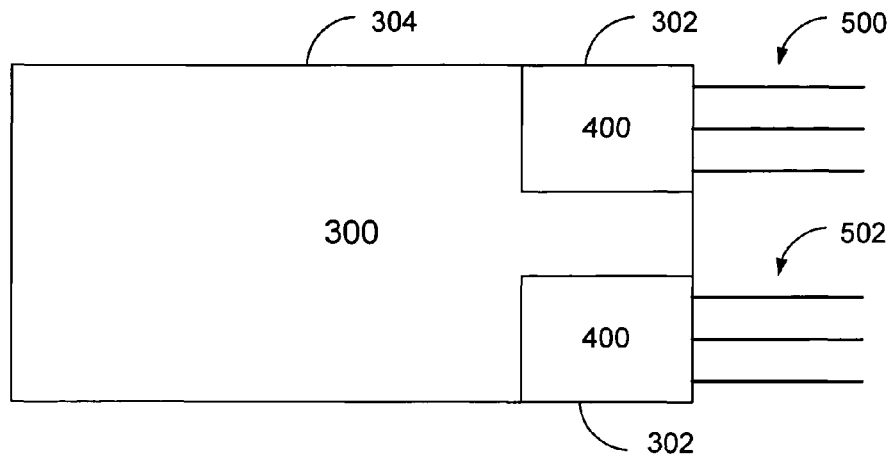
FIG. 5A is a block diagram of an example embodiment of a server including two single-phase AC power modules according to the present invention.

FIG. 5A is a block diagram of an example embodiment of a server including two single-phase AC power supply modules according to the present invention. In this example embodiment of the present invention, the server 300, including a server chassis 304, and two power supply module bays 302, is equipped with two single-phase AC power supply modules 400 including power cables electrically coupled to a first single-phase AC power source 500 and power cables electrically coupled to a second single-phase AC power source 502.

Figure 5B:
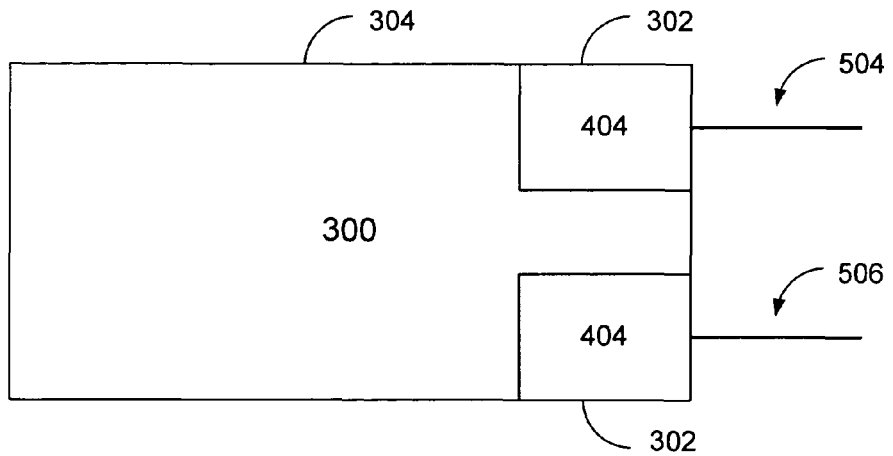
FIG. 5B is a block diagram of an example embodiment of a server including two 3-phase AC power modules according to the present invention.

FIG. 5B is a block diagram of an example embodiment of a server including two 3-phase AC power supply modules according to the present invention. In this example embodiment of the present invention, the server 300, including a server chassis 304, and two power supply module bays 302, is equipped with two 3-phase AC power supply modules 404 including power cables electrically coupled to a first 3-phase AC power source 504 and power cables electrically coupled to a second 3-phase AC power source 506.

Figure 6:
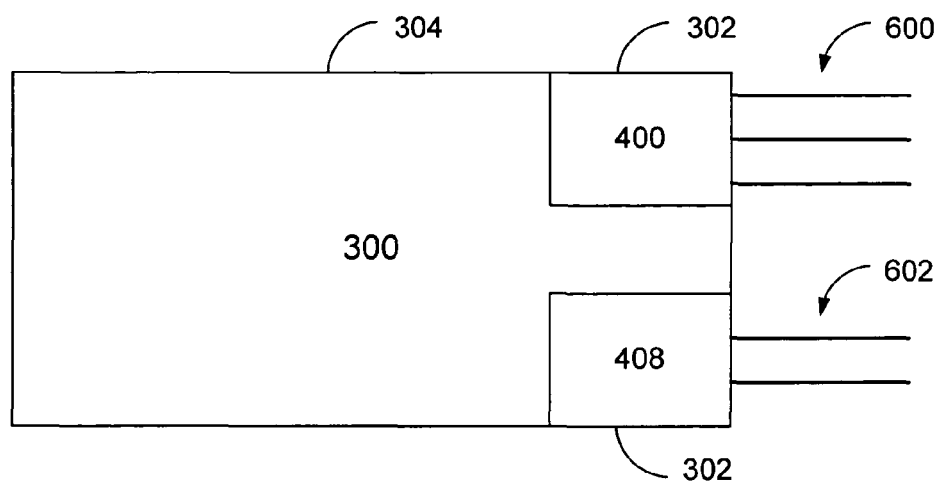
FIG. 6 is a block diagram of an example embodiment of a server including one single-phase AC power module and one DC power module according to the present invention.

FIG. 6 is a block diagram of an example embodiment of a server including one single-phase AC power module and one DC power module according to the present invention. In this example embodiment of the present invention, the server 300, including a server chassis 304, and two power supply module bays 302, is equipped with one single-phase AC power supply module 400 including power cables electrically coupled to a single-phase AC power source 600 and one DC power supply module 408 including power cables electrically coupled to a DC power source 602. Those of skill in the art will recognize that any number and any combination of power supply modules may be used within the scope of the present invention While the example embodiments of the present invention discussed above comprise single-phase, 3-phase AC power modules, and DC power modules, those of skill in the art will recognize that other power modules, such as modules with differing voltages, may be used within the scope of the present invention.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A computer server comprising:
    a server chassis;
    at least one of a single-phase AC and 3-phase AC power supply module removeably mechanically coupled to said server chassis, and removeably electrically coupled to said computer server; and
    a power supply module bay within said server chassis, configured to removeably mechanically and interchangeably directly couple one of said single-phase AC and 3-phase AC power supply modules to said server chassis, and to removeably electrically and interchangeably directly couple one of said single-phase AC and 3-phase AC power supply modules to said computer server.

2. The computer server as recited in claim 1, wherein said server chassis includes more than one power supply module bays.

3. The computer server as recited in claim 2, wherein said computer server includes more than one single-phase AC and 3-phase AC power supply modules.

4. The computer server as recited in claim 3, wherein said more than one power supply module bays removeably and interchangeably directly couple a different one of said single-phase AC and 3-phase AC power supply module configurations to said server chassis and said computer server.

5. A computer server as recited in claim 1, wherein said power supply module bay is further configured to removeably mechanically and interchangeably directly couple a DC power supply module to said server chassis, and to removeably electrically and interchangeably directly couple said DC power supply module to said computer server.

6. The computer server as recited in claim 5, wherein each of the said more than one power supply module bays removeably and interchangeably directly couple a different one of said single-phase AC power supply module, 3-phase AC power supply module, and DC power supply module configurations to said server chassis and said computer server.

7. A computer server comprising;
a server chassis;
at least one power supply module bay contained within the server chassis;
means within each of the at least one power supply module bay for removeably electrically and directly interchangeably coupling one of a single-phase AC and 3-phase AC power supply modules to said computer server; and
means within each of the at least one power supply module bay for removeably mechanically and directly interchangeably coupling one of said single-phase AC and 3-phase AC power supply modules to said server chassis.

8. The computer as recited in claim 7, further comprising:
said power supply module removeably electrically coupled to said computer server, and removeably mechanically coupled to said server chassis.

9. The computer server as recited in claim 8,
wherein said power supply module is a single-phase AC power supply module.

10. The computer server as recited in claim 8,
wherein said power supply module is a 3-phase AC power supply module.

11. The computer server as recited in claim 7,
wherein said means for removeably electrically and directly interchangeably coupling one of said single-phase AC and 3-phase AC power supply modules to said computer server is further configured to electrically couple a DC power supply module.

12. The computer server as recited in claim 7,
wherein said means for removeably mechanically and directly interchangeably coupling one of said single-phase AC and 3-phase AC power supply modules to said server chassis is further configured to mechanically couple a DC power supply module.

13. The computer server as recited in claim 7,
wherein said server chassis includes more than one power supply module bay.

14. A method of supplying power to a computer server comprising:
providing a server chassis including at least one power supply module bay, the at least one power supply module bay configured to replaceably accept one of a plurality of power supply modules;
removing a first power supply module of a first power configuration within the at least one power supply module bay, wherein the first power supply module is removeably mechanically disengaged from the server chassis and removeably electrically disengaged from the computer server; and
installing a second power supply module of a second power configuration within the at least one power supply module bay, wherein the second power supply module is removeably mechanically coupled to the server chassis and removeably electrically coupled to the computer server,
wherein the first and second power configurations are different from one another.

15. The method as recited in claim 14, wherein the first power configuration is one of a group of single-phase AC, 3-phase AC or DC.

16. The method as recited in claim 14, wherein the second power configuration is one of a group of single-phase AC, 3-phase AC or DC.

* * * * *